United States Patent
Osawa

(10) Patent No.: US 7,563,382 B2
(45) Date of Patent: Jul. 21, 2009

(54) MASK AND METHOD OF FABRICATING THE SAME, AND METHOD OF MACHINING MATERIAL

(75) Inventor: Atsushi Osawa, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 842 days.

(21) Appl. No.: 10/927,027

(22) Filed: Aug. 27, 2004

(65) Prior Publication Data

US 2005/0048416 A1     Mar. 3, 2005

(30) Foreign Application Priority Data

Aug. 29, 2003   (JP)   ............... 2003-209764
Feb. 10, 2004   (JP)   ............... 2004-032956

(51) Int. Cl.
*B44C 1/22*   (2006.01)
*H01L 21/00*  (2006.01)

(52) U.S. Cl. ............... 216/47; 216/2; 216/41; 216/51; 438/689; 438/706; 438/717

(58) Field of Classification Search ............... 216/2, 216/41, 47, 51; 438/689, 706, 717
See application file for complete search history.

(56) References Cited

U.S. PATENT DOCUMENTS

| | | | |
|---|---|---|---|
| 4,737,425 A | | 4/1988 | Lin et al. |
| 5,735,721 A | * | 4/1998 | Choi ............... 445/24 |
| 6,140,226 A | * | 10/2000 | Grill et al. ............... 438/637 |
| 6,470,272 B2 | * | 10/2002 | Cong et al. ............... 701/301 |
| 6,475,921 B2 | * | 11/2002 | Sandhu ............... 438/717 |
| 7,078,334 B1 | * | 7/2006 | Chowdhury et al. ............... 438/637 |
| 2003/0143472 A1 | * | 7/2003 | Koizumi et al. ............... 430/5 |

FOREIGN PATENT DOCUMENTS

| | | |
|---|---|---|
| JP | 54-29854 A | 3/1979 |
| JP | 3-86479 A | 4/1991 |
| JP | 4-147900 A | 5/1992 |
| JP | 5-205636 A | 8/1993 |
| JP | 6-243789 A | 9/1994 |
| JP | 6-251702 A | 9/1994 |
| JP | 7-30226 A | 1/1995 |
| JP | 10-148927 A | 6/1998 |

* cited by examiner

*Primary Examiner*—Shamim Ahmed
(74) *Attorney, Agent, or Firm*—Sughrue Mion, PLLC

(57) ABSTRACT

A method of fabricating a mask which can endure use for a long time and can be used for forming an isolated pattern with a high aspect ratio. The method includes the steps of: forming a soft material layer by disposing a soft material having positive photo sensitivity and adhesion or adhesiveness on a material as a target of machining; forming a hard material layer by disposing an opaque hard material in which a desired mask pattern has been formed in advance on the soft material layer; and forming the mask pattern in the soft material layer by performing exposure to light and development on the soft material layer by using the hard material layer as a photomask.

19 Claims, 16 Drawing Sheets

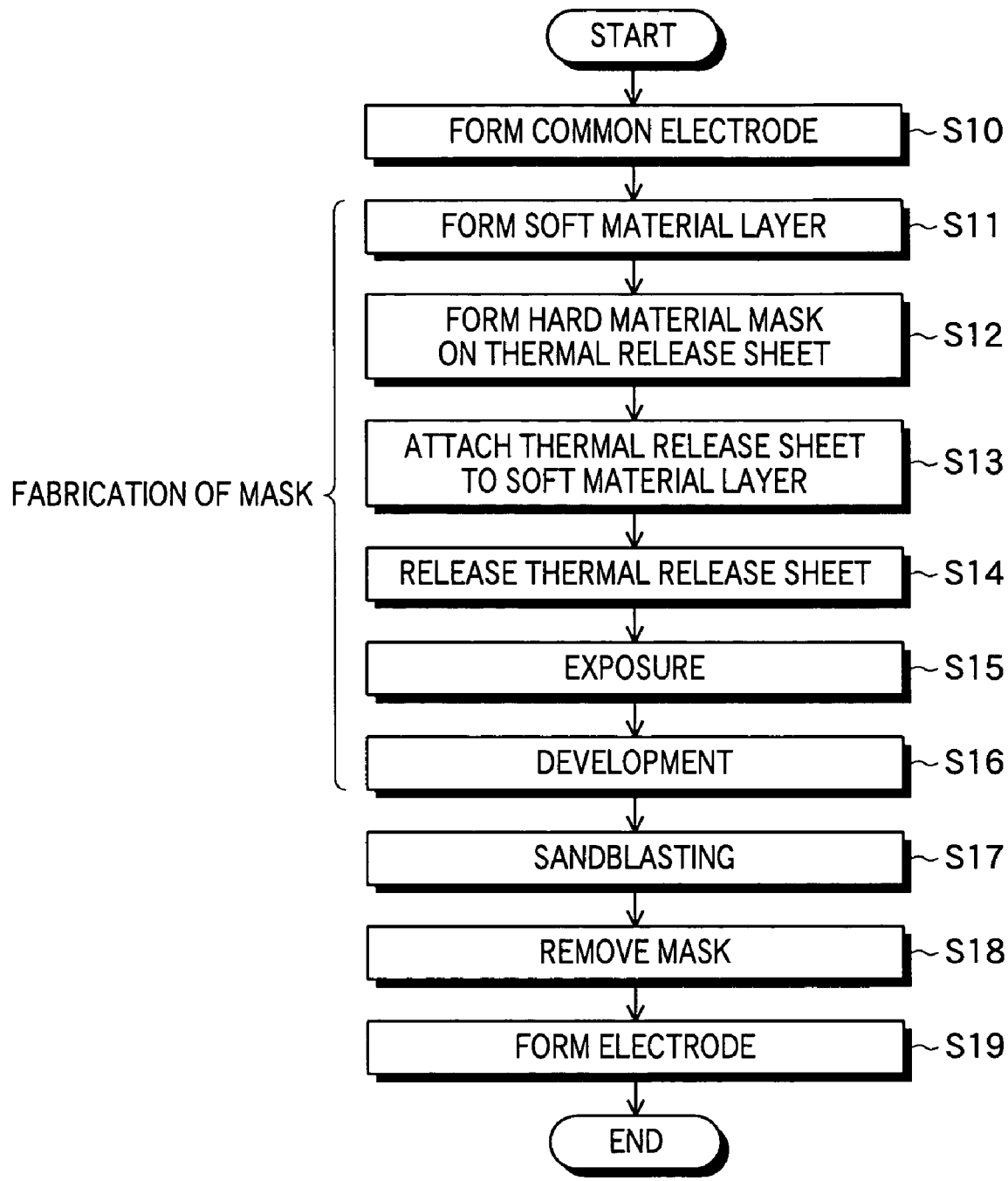

MASK AND METHOD OF FABRICATING THE SAME, AND METHOD OF MACHINING MATERIAL

BACKGROUND OF THE INVENTION

1. Field of the Invention

The present invention relates to a mask to be used when machining a material and a method of fabricating the mask, and further relates to a method of machining a material.

2. Description of a Related Art

Conventionally, as a machining method of a hard and brittle material such as glass or ceramic or a method of micro machining a semiconductor, the sandblasting method and the dry or wet etching method are known. The sandblasting method is a machining method of performing drilling and polishing a workpiece by blasting a polishing material (abrasive grain) at high pressure (for example, 0.3 MPa to 0.4 MPa) from a nozzle to spray the material on the workpiece. In the sandblasting method, a nozzle having a diameter about 0.5 mm to 5 mm is generally used, and, further by using a mask, a micro pattern can be formed on the hard and brittle material. Such sandblasting method is used in the fields such as the manufacture of a plasma display panel, the manufacture of an ultrasonic transducer array, and MEMS (micro electromechanical system) related devices. Further, the plasma etching method as one of the dry etching methods is a technique for etching a workpiece by making a reactive gas into a plasma state under low vacuum pressure, and mainly used for micromachining a semiconductor.

In the sandblasting method, a member having elasticity such as a dry-film resist is used as a mask. The reason is as follows. Since not only the target of machining but also the mask is damaged by the sprayed abrasive grain, it is necessary to absorb the shock by the abrasive grain. Further, in order to endure the reduction of the mask thickness, the mask is made to have a certain degree of thickness.

Generally, in the case where a hard material is machined or a target of machining is deeply drilled by the sandblasting method, abrasive grain is blasted for a long time. However, the longer, the blasting time of abrasive grain, the greater the damage to the mask becomes. Especially, since the edge portion in the mask peripheral part is damaged greatly, the mask peripheral part recedes and the mask shape cannot be maintained. On this account, the formed pattern becomes tapered, and thus, there has been a problem that formation of a precise pattern with a high aspect ratio (drilling depth: pattern width) is difficult by the sandblasting method.

In order to reduce the mask damage due to abrasive grain, it is conceivable that a hard member such as a metal is used as a mask. However, if a member such as a metal is used, the shock by the abrasive grain cannot be absorbed, and the durability of the mask becomes degraded instead. Further, in order to make the mask usable for a long time even if the mask is damaged, it is conceivable that the thickness of the mask is made thicker. However, if the mask becomes thicker, the capability to reliably shield the target of machining from abrasive grain is degraded, and therefore, the accuracy of the pattern formation becomes lower.

The following three documents, Japanese Patent Application Publication JP-A-5-205636, JP-A-6-243789, and JP-A-6-251702 disclose that the sandblasting method is used when a plasma display substrate is manufactured. From among the three documents, the first document JP-A-5-205636 discloses in FIG. 3 a metal mask formed by providing an adhesive layer 12 on the back side of a metal thin plate 11 and a protective layer 13 on the front side thereof. The adhesive layer 12 brings the metal mask into close contact with the upper surface of a barrier 2 (FIG. 1 of the first document) and absorbs the rebound force of an abrasive at the time of sandblasting treatment. The protective layer 13 absorbs the shock of the abrasive at the time of sandblasting treatment and prevents the metal thin plate 11, especially its edge portion from wear, heat generation, and deformation. Further, the first document also discloses in FIG. 4 a metal mask having greater effect of absorbing the rebound force of an abrasive at the time of sandblasting treatment by further providing a cushion layer 14 consisting of a dry film between the metal thin plate 11 and the adhesive layer 12 in the above-mentioned metal mask.

Thus, by using a composite mask in combination of a soft material and a hard material, the durability of the mask can be improved. However, such composite mask is for forming a "hollowing-out pattern" to be used when fabricating a fluorescent material pattern. That is, there is a problem that mask for forming an isolated pattern, which is a reversal pattern of the "hollowing-out pattern", cannot be fabricated by the methods disclosed in the above-mentioned documents.

SUMMARY OF THE INVENTION

The present invention has been achieved in view of the above-described problems. An object of the present invention is to provide a mask which can endure the use for a long time and which can be used for forming an isolated pattern with a high aspect ratio.

In order to solve the above-described problems, a fabricating method of a mask according to a first aspect of the present invention includes the steps of: (a) forming a soft material layer by disposing a soft material having positive photosensitivity and adhesion or adhesiveness on a material as a target of machining; (b) forming a hard material layer by disposing an opaque hard material, in which a desired mask pattern has been formed in advance, on the soft material layer; and (c) forming the mask pattern in the soft material layer by performing exposure to light and development on the soft material layer by using the hard material layer as a photomask.

A fabricating method of a mask according to a second aspect of the present invention includes the steps of: (a) forming a soft material layer by disposing a soft material having adhesion or adhesiveness on a material as a target of machining; (b) forming a hard material layer by disposing a hard material, in which a desired mask pattern has been formed in advance, on the soft material layer; and (c) forming the mask pattern in the soft material layer by etching the soft material layer by using the hard material layer as a mask.

A fabricating method of a mask according to a third aspect of the present invention includes the steps of: (a) forming a soft material layer by disposing a soft material having negative photosensitivity and adhesion or adhesiveness on a material as a target of machining; (b) forming a desired mask pattern in the soft material layer by performing exposure to light and development on the soft material layer by using a photomask in which the mask pattern has been formed; and (c) disposing a hard material, in which the mask pattern has been formed in advance, on the soft material layer, in which the mask pattern has been formed, while aligning them with each other.

A fabricating method of a mask according to a fourth aspect of the present invention includes the steps of: (a) forming a first soft material layer by disposing a soft material having adhesion or adhesiveness on a material as a target of machining; (b) forming a hard material layer by disposing a hard material on the first soft material layer; (c) forming a second soft material layer by disposing a soft material having photosensitivity and adhesion or adhesiveness on the hard material layer; (d) forming a desired mask pattern in the second soft material layer by performing exposure to light and development on the second soft material layer by using a photomask in which the mask pattern has been formed; and (e) forming the mask pattern in the soft material layer and the hard material layer by using the second soft material layer, in which the mask pattern has been formed, as a mask.

A fabricating method of a mask according to a fifth aspect of the present invention includes the steps of: (a) forming a soft material layer by applying an elastic material in a liquid form or a paste form onto a material as a target of machining to form a mask pattern and curing the material; and (b) forming a hard material layer by applying a hard material in a liquid form or a paste form onto the soft material layer and curing the hard material.

A mask according to one aspect of the present invention includes: a soft material layer formed on a material as a target of machining by employing a soft material, the soft material layer having an isolated mask pattern; and a hard material layer formed on the soft material layer by employing a hard material.

A machining method of a material according to the first aspect of the present invention includes the steps of: (a) forming a soft material layer by disposing a soft material having positive photosensitivity and adhesion or adhesiveness on a material as a target of machining; (b) forming a hard material layer by disposing an opaque hard material, in which a desired mask pattern has been formed in advance, on the soft material layer; (c) forming the mask pattern in the soft material layer by performing exposure to light and development on the soft material layer by using the hard material layer as a photomask; and (d) removing a region of the material as the target of machining, on which the mask pattern is not formed, in accordance with a sandblasting method or an etching method.

A machining method of a material according to the second aspect of the present invention includes the steps of: (a) forming a soft material layer by disposing a soft material having adhesion or adhesiveness on a material as a target of machining; (b) forming a hard material layer by disposing a hard material, in which a desired mask pattern has been formed in advance, on the soft material layer; (c) forming the mask pattern in the soft material layer by etching the soft material layer by using the hard material layer as a mask; and (d) removing a region of the material as the target of machining, on which the mask pattern is not formed, in accordance with a sandblasting method or an etching method.

A machining method of a material according to the third aspect of the present invention includes the steps of: (a) forming a soft material layer by disposing a soft material having negative photosensitivity and adhesion or adhesiveness on a material as a target of machining; (b) forming a mask pattern in the soft material layer by performing exposure to light and development on the soft material layer by using a photomask in which a desired mask pattern has been formed; (c) disposing a hard material, in which the mask pattern has been formed in advance, on the soft material layer, in which the mask pattern has been formed, while aligning them with each other; and (d) removing a region of the material as the target of machining, on which the mask pattern is not formed, in accordance with a sandblasting method or an etching method.

A machining method of a material according to the fourth aspect of the present invention includes the steps of: (a) forming a first soft material layer by disposing a soft material having adhesion or adhesiveness on a material as a target of machining; (b) forming a hard material layer by disposing a hard material on the first soft material layer; (c) forming a second soft material layer by disposing a soft material having photosensitivity and adhesion or adhesiveness on the hard material layer; (d) forming a desired mask pattern in the second soft material layer by performing exposure to light and development on the second soft material layer by using a photomask in which the mask pattern has been formed; (e) forming the mask pattern in the first soft material layer and the hard material layer by using the second soft material layer, in which the mask pattern has been formed, as a mask; and (f) removing a region of the material as the target of machining, on which the mask pattern is not formed, in accordance with a sandblasting method or an etching method.

A machining method of a material according to the fifth aspect of the present invention includes the steps of: (a) forming a soft material layer by applying an elastic material in a liquid form or a paste form to a material as a target of machining to form a mask pattern and curing the elastic material; (b) forming a hard material layer by applying a hard material in a liquid form or a paste form on the soft material layer and curing the hard material; and (c) removing a region of the material as the target of machining, on which the mask pattern is not formed, in accordance with a sandblasting method or an etching method by using the soft material layer and the hard material layer as a mask.

According to the present invention, durability of the mask to be used in the sandblasting method can be improved. As a result, the machining can be continued for a long time, which increases kinds of materials such as the hard and brittle material that can be machined in accordance with the sandblasting method. Further, high aspect pattern formation with an aspect ratio exceeding 1:10 and a precise machining in which surface precision of the pattern edge portion is improved can be performed.

BRIEF DESCRIPTION OF THE DRAWINGS

FIG. 3 is a flowchart showing a manufacturing method of an ultrasonic transducer array including a fabricating method of the mask according to the first embodiment of the present invention;

DESCRIPTION OF THE PREFERRED EMBODIMENTS

Figure 1:
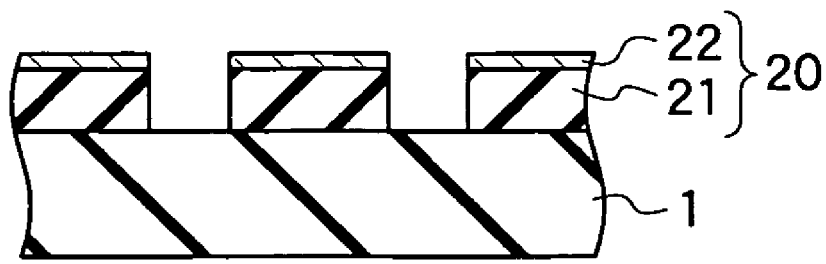
FIG. 1 is a sectional view showing a mask according to the first embodiment of the present invention.

Hereinafter, preferred embodiments of the present invention will be described in detail by referring to the drawings. The same component elements are assigned with the same reference numerals and the description thereof will be omitted.

FIG. 1 is a sectional view showing a mask according to the first embodiment of the present invention. The mask 20 is, for example, a mask to be used when sandblasting a hard and brittle material and, in the embodiment, formed on a PZT (Pb (lead) zirconate titanate) plate material 1 as a target of machining.

The mask 20 includes a soft material layer 21 and a hard material layer 22. The soft material layer 21 is formed by employing a soft material having elasticity. As the soft material layer 21, a material having a Young's modulus from on the order of 1 kgf/mm$^2$ to about 50 kgf/mm$^2$ is desirably used, and specifically, a dry-film resist (DFR), a general resist, urethane, an adhesive and so on can be used.

The hard material layer 22 is formed by employing a film of a hard material such as a metal or ceramics and protects the edge of the soft material layer 21. As the hard material layer 22, a material having a Young's modulus on the order of $10^4$ kgf/mm$^2$ is desirably used. As such a material, a metal such as SUS (stainless steel), copper (Cu), iron (Fe), nickel (Ni), tungsten (W), and molybdenum (Mo), or an alloy of them, PZT, PLZT (Pb (lead) lanthanum zirconate titanate), an oxide such as titanium oxide ($TiO_2$), zinc oxide (ZnO), tin oxide (SnO), alumina ($Al_2O_3$), barium titanate ($BaTiO_3$), SRO (strontium ruthenium oxide: $SrRuO_3$), glass ($SiO_2$), and ITO (indium tine oxide), a nitride, etc. can be cited.

As materials to be used for the hard material layer 22 as an upper layer and the soft material layer 21 as a lower layer, selection of a combination that satisfies the following relationships is needed.

Young's modulus of the hard material
>Young's modulus of the soft material

Further, it is desired that Young's modulus of the hard material is a hundred times or more larger than Young's modulus of the soft material. For example, in the case where a dry-film resist (Young's modulus: about 0.5 kgf/mm$^2$ to 2.5 kgf/mm$^2$) is used as the soft material and SUS 340 (Young's modulus: about 20000 kgf/mm$^2$) is used as the hard material, the above-mentioned condition is sufficiently satisfied. Alternatively, copper (Young's modulus: about 13868 kgf/mm$^2$) may be used as the hard material.

Thus, in the embodiment, the soft material layer 21 is protected at the time of blasting by providing the hard material layer 22 on the soft material layer 21, and thereby, the film thickness of the mask can be prevented from being thinner and the pattern can be prevented from being deformed due to receding of the edge. Further, by providing the soft material layer 21 having high elasticity, the soft material layer 21 serves as a cushion to absorb the shock applied to the hard material layer 22 at the time of blasting, and thereby, the durability of the hard material layer 22 can be made higher. Therefore, by using such mask, abrasive grain can be blasted for a long time while maintaining the mask pattern, and high-precision machining with high aspect can be performed.

Next, a fabricating method of the mask according to the first embodiment of the present invention and a machining method of a material using the mask will be described by referring to FIG. 2 to FIG. 5D. In the embodiment, the case of manufacturing an ultrasonic transducer array in accordance with the sandblasting method is taken as an example.

Figure 2:
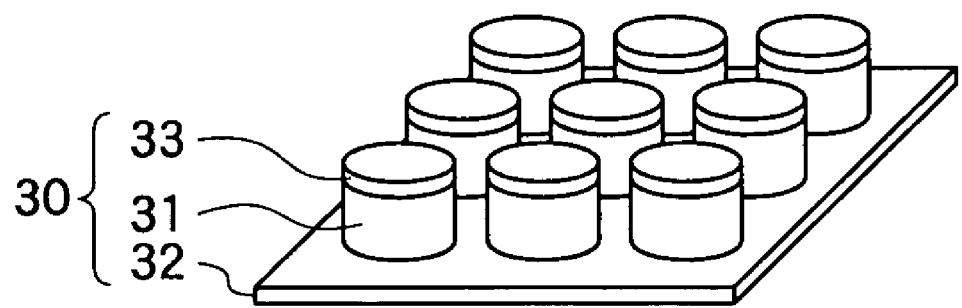
FIG. 2 is a perspective view showing an ultrasonic transducer array.

FIG. 2 is a perspective view showing an ultrasonic transducer array. This ultrasonic transducer array includes plural piezoelectric elements 31 arranged in a two-dimensional manner, a common electrode 32, and electrodes 33 formed on the respective piezoelectric elements 31. By applying voltages to the piezoelectric elements 31 via the common electrode 32 and the electrodes 33, the piezoelectric elements 31 expand and contract by the piezoelectric effect to generate ultrasonic waves. The plural piezoelectric elements 31 are driven while providing time differences, and thereby, the ultrasonic waves generated from the respective piezoelectric elements are synthesized and an ultrasonic beam is transmitted.

FIG. 3 is a flowchart showing a manufacturing method of an ultrasonic transducer array using the mask according to the embodiment, and FIG. 4A to FIG. 5D are diagrams for explanation of the manufacturing method of such an ultrasonic transducer array.

Figure 4A:
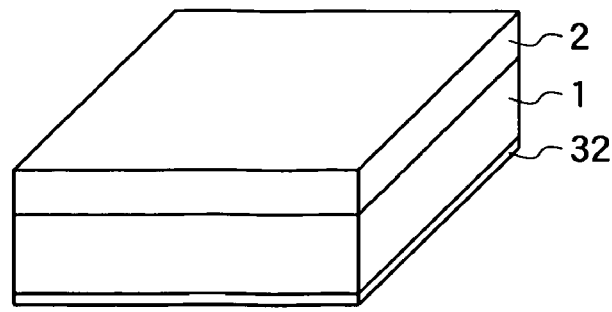
FIGS. 4A to 4D are diagrams for explanation of the manufacturing method of the ultrasonic transducer array including the fabricating method of the mask according to the first embodiment of the present invention.

At step S10 in FIG. 3, as shown in FIG. 4A, the common electrode 32 is formed by attaching a metal plate on one surface of the PZT plate material 1 as the target of machining.

Then, at step S11, as shown in FIG. 4A, the soft material layer 2 is formed on the PZT plate material 1. In the embodiment, as the soft material layer 2, a positive type dry-film resist is used, and this is stacked on the PZT plate material 1. As the dry-film resist, dry-film resists for sandblasting in thicknesses of, for example, 50 μm, 100 μm, 120 μm and so on are commercially available, and these can be used. In the dry-film resist, as long as it has a film thickness of 10 μm or more, a cushioning property is recognized. In the case where a pattern of, for example, 300 μm×300 μm is formed, the resist about 50 μm is good. If the film thickness becomes too much greater, the cushioning property becomes too high and the efficiency of the sandblasting is reduced. That is, the film thickness is desirably selected so that the aspect ratio (drilling depth:pattern width) may be generally within 1/6.

Figure 4B:
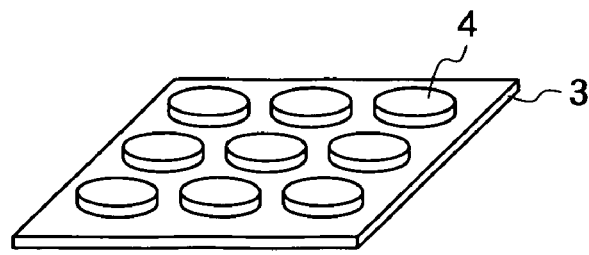

Next, at step S12, as shown in FIG. 4B, a hard material mask 4 having a desired pattern is formed on a thermal release sheet 3 by employing a hard material such as a metal in accordance with an etching method or the like. Here, the thermal release sheet is a sheet-like adhesive member having an adhesive surface, and the sheet loses the adhesion of the adhesive surface and becomes releasable by being applied with heat. As such adhesive member, for example, a product of NITTO DENKO CORPORATION, "RIVALPHA" can be used.

Figure 4C:
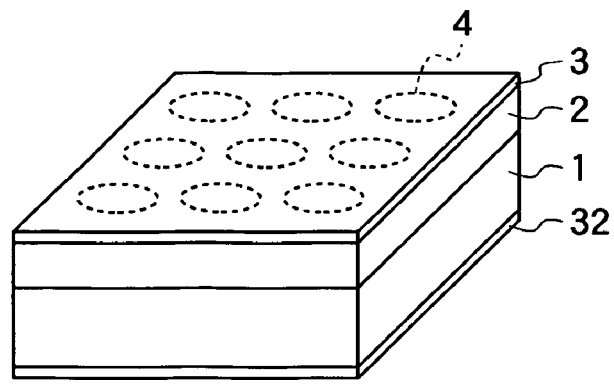

At step S13, the thermal release sheet 3 as shown in FIG. 4B, on which the hard material mask 4 is formed, is attached to the soft material layer (dry-film resist) 2 as shown in FIG. 4A. At that time, as shown in FIG. 4C, the hard material mask 4 is brought into contact with the soft material layer 2. Since the dry-film resist has adhesion, by attaching the thermal release sheet 3, on which the hard material mask 4 is formed, to the dry-film resist and applying pressure thereto, the hard material mask 4 adheres to the dry-film resist.

Here, in the case where a film member such as the dry-film resist is used as the soft material layer 2, steps S12 and S13 may be performed at the same time. That is, the dry-film resist and the thermal release sheet 3, on which the hard material mask 4 is formed, are overlapped on the PZT plate material 1 and applied with pressure by a roller or the like.

Figure 4D:
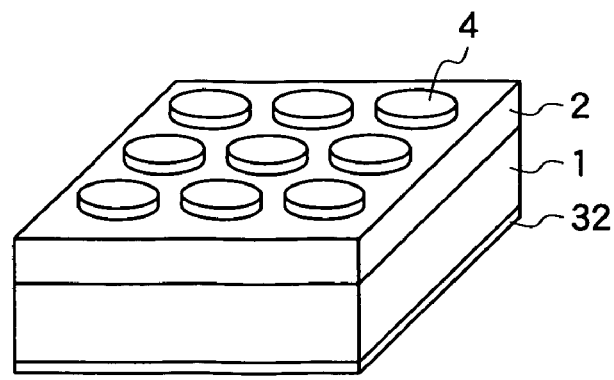

At step S14, the thermal release sheet 3 is overheated and released from the soft material layer 2 and the hard material mask 4. Thereby, as shown in FIG. 4D, the hard material mask 4 having an isolated pattern is formed on the soft material layer 2.

Figure 5A:
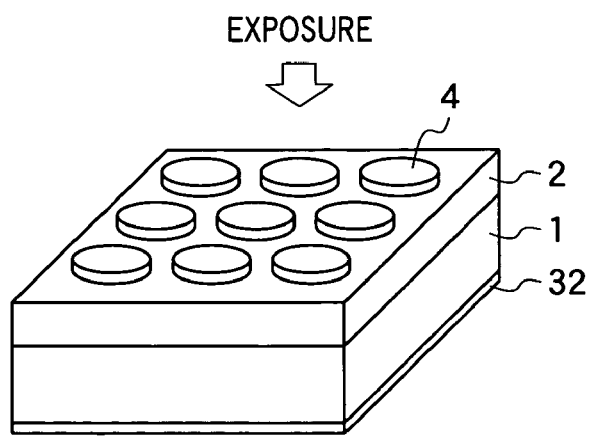
FIGS. 5A to 5D are diagrams for explanation of the manufacturing method of the ultrasonic transducer array including the fabricating method of the mask according to the first embodiment of the present invention.
Figure 5B:
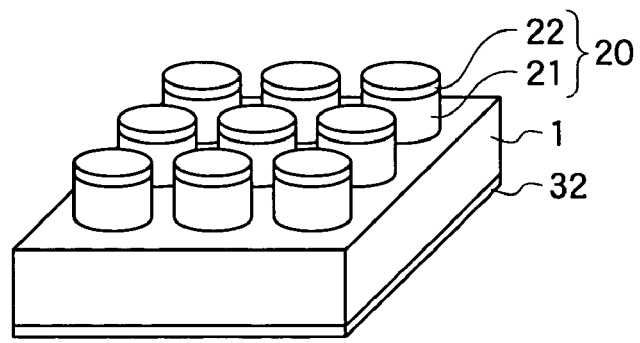

At step S15, as shown in FIG. 5A, the soft material layer (dry-film resist) 2, on which the hard material mask 4 is formed, is exposed by using, for example, ultraviolet light and, at step S16, development is performed by using, for example, a weakly alkaline solution. Thereby, as shown in FIG. 5B, the region of the soft material layer 2, on which the hard material mask 4 is not formed, is removed, and the mask 20 including the soft material layer 21 and the hard material layer 22 is fabricated.

Figure 5C:
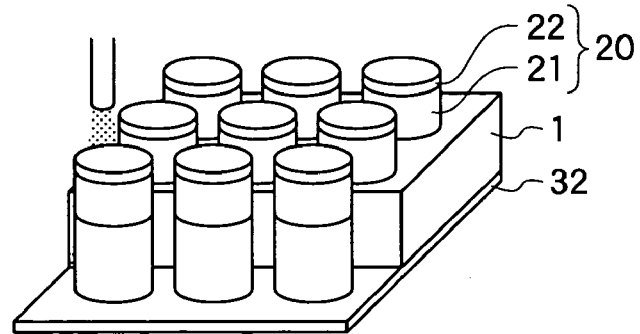

At step S17, as shown in FIG. 5C, sandblasting is performed by spraying abrasive grain onto the PZT plate material 1 on which the mask 20 has been formed. As the abrasive grain, for example, alumina ($AL_2O_3$), silicon carbide (SiC), zirconia (ZnOx), tungsten carbide (WC), etc. can be used.

Figure 5D:
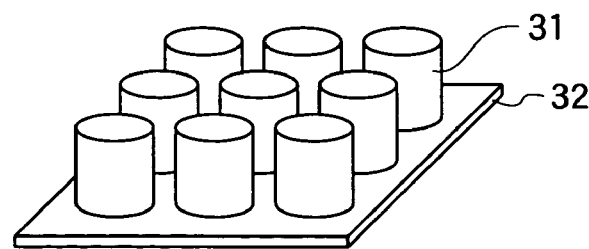

Then, at step S18, the mask 20 is removed in accordance with a method such as wet etching, for example. Thereby, as shown in FIG. 5D, a structure in which the plural PZT elements 31 are arranged in a desired layout is fabricated. Furthermore, the electrodes 33 are formed on the upper surfaces of the respective PZT elements 31 in accordance with a method such as sputtering. Thereby, as shown in FIG. 2, the ultrasonic transducer array including plural ultrasonic transducers 30 is fabricated.

As described above, according to the embodiment, by combining the soft material layer and the hard material layer, the durability of the mask in sandblasting can be improved. Therefore, the mask form is maintained even blasted for a long time, and a micropattern with a high aspect ratio can be formed. Especially, in the case of using abrasive grain having large specific gravity and high blasting performance as tungsten carbide, by combining with the mask according to the embodiment, machining by taking advantage of high blasting performance can be performed. Further, according to the embodiment, since the mask pattern is formed by forming the metal mask on the thermal release sheet and transferring it onto the soft material layer, not only the hollowing-out pattern but also the isolated pattern, which is the reversal pattern of the hollowing-out pattern, can be formed.

In this embodiment, the thermal release sheet is used when the hard material mask is formed, however, a member that can be released by a stimulus other than heat may be used. For example, a UV release sheet that loses adhesion by being applied with ultraviolet light may be used.

Further, in the embodiment, the common electrode is provided by attaching the metal plate to the PZT plate material, however, the common electrode may be provided by forming a metal film on the PZT plate material. In this case, the metal film may be formed on the PZT plate material first, or the metal film may be formed after the sandblasting on the PZT plate material is completed.

Figure 6:
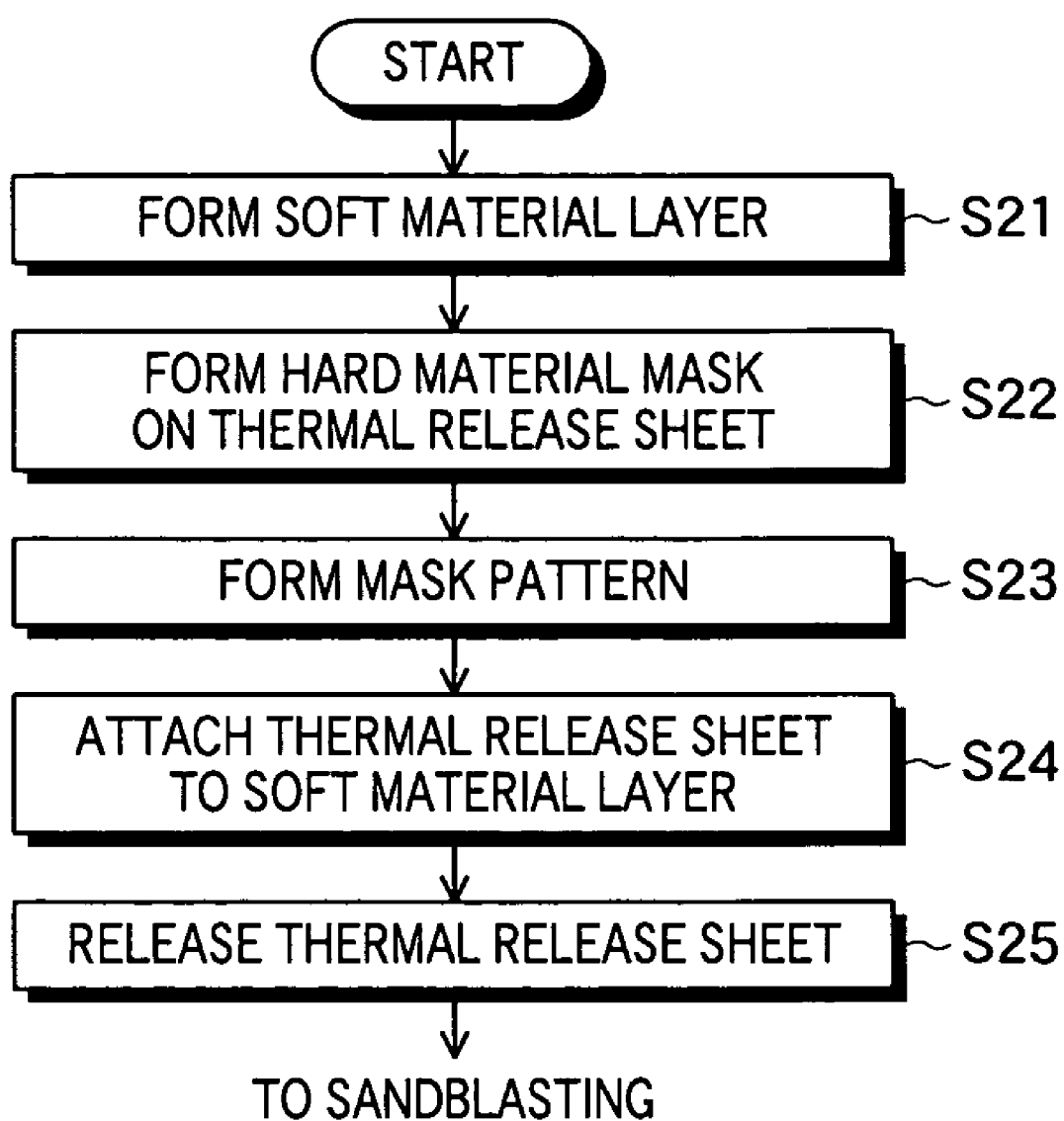
FIG. 6 is a flowchart showing a fabricating method of a mask according to the second embodiment of the present invention.

Next, a fabricating method of a mask according to the second embodiment will be described. In the first embodiment of the present invention, the positive type photosensitive dry-film resist is used as the soft material layer 21, however, a negative type photosensitive dry-film resist may be used. FIG. 6 is a flowchart showing the fabricating method of a mask according to the second embodiment. Further, FIGS. 7A to 7D are diagrams for explanation of the fabricating method of the mask using a negative type photosensitive dry-film resist.

Figure 7A:
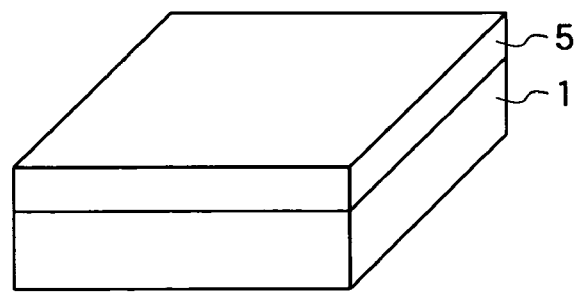
FIGS. 7A to 7D are diagrams for explanation of the fabricating method of the mask according to the second embodiment of the present invention.

At step S21 in FIG. 6, as shown in FIG. 7A, a soft material layer 5 is formed on a PZT plate material 1 as a target of machining. In this embodiment, as the soft material layer 5, a negative type photosensitive dry-film resist is used, and it is stacked on the PZT plate material 1.

Figure 7B:
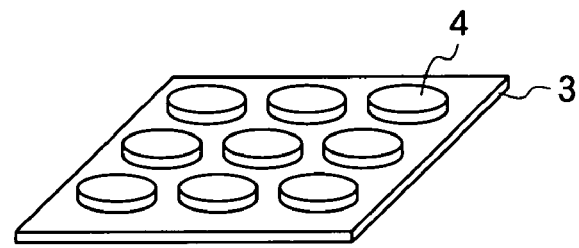

Then, at step S22, as shown in FIG. 7B, a hard material mask 4 made of a metal or the like is formed on a thermal release sheet 3 in accordance with an etching method or the like.

Figure 7C:
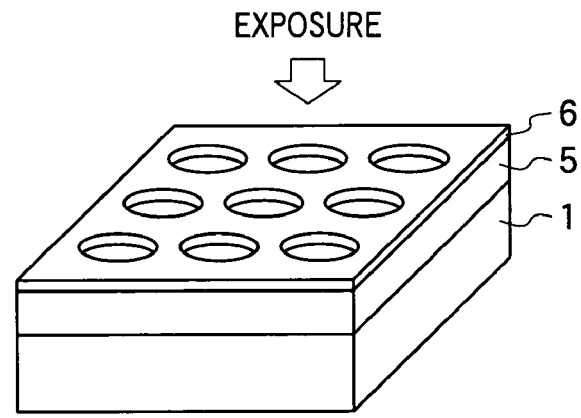
Figure 7D:
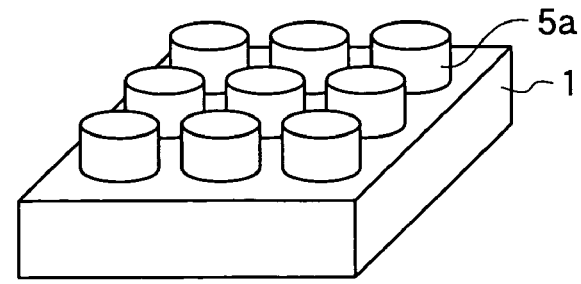

At step S23, as shown in FIG. 7C, a mask pattern is formed by performing exposure, development, etc. on the soft material layer (dry-film resist) by using a photomask 6. As the photomask 6, a mask having the same pattern as the hard material mask 4 formed at step S22 is used. Thereby, as shown in FIG. 7D, a soft material layer 5a, in which the mask pattern is formed, is formed.

Figure 8A:
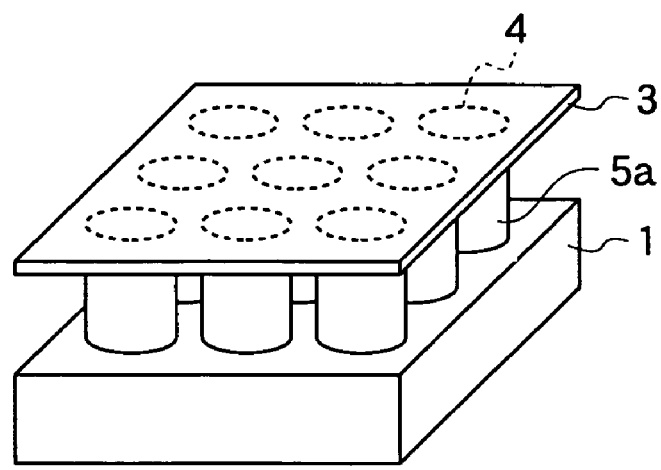
FIGS. 8A and 8B are diagrams for explanation of the fabricating method of the mask according to the second embodiment of the present invention.

At step S24, the thermal release sheet 3, in which the hard material mask 4 has been formed at step S21, is attached onto the soft material layer 5a in which the mask pattern has been formed. At that time, as shown in FIG. 8A, the sheet is disposed while making alignment so that the position of the hard material mask 4 may match the position of the mask pattern of the soft material layer 5a.

Figure 8B:
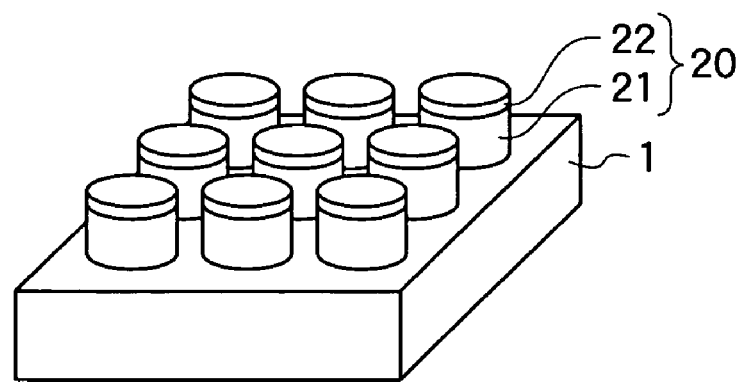

At step S25, the thermal release sheet 3 is overheated and released from the hard material mask 4 and the soft material layer 5a. Thereby, as shown in FIG. 8B, the mask 20 including the soft material layer 21 and the hard material layer 22 is fabricated.

Furthermore, a desired pattern is formed on the PZT plate material 1 by performing sandblasting by using the mask 20.

Next, a fabricating method of a mask according to the third embodiment will be described. In the first and second embodiments of the present invention, the photosensitive dry-film resist is used as the soft material layer 21, however, the third embodiment is characterized in that a non-photosensitive member is used as the soft material layer 21.

Figure 9:
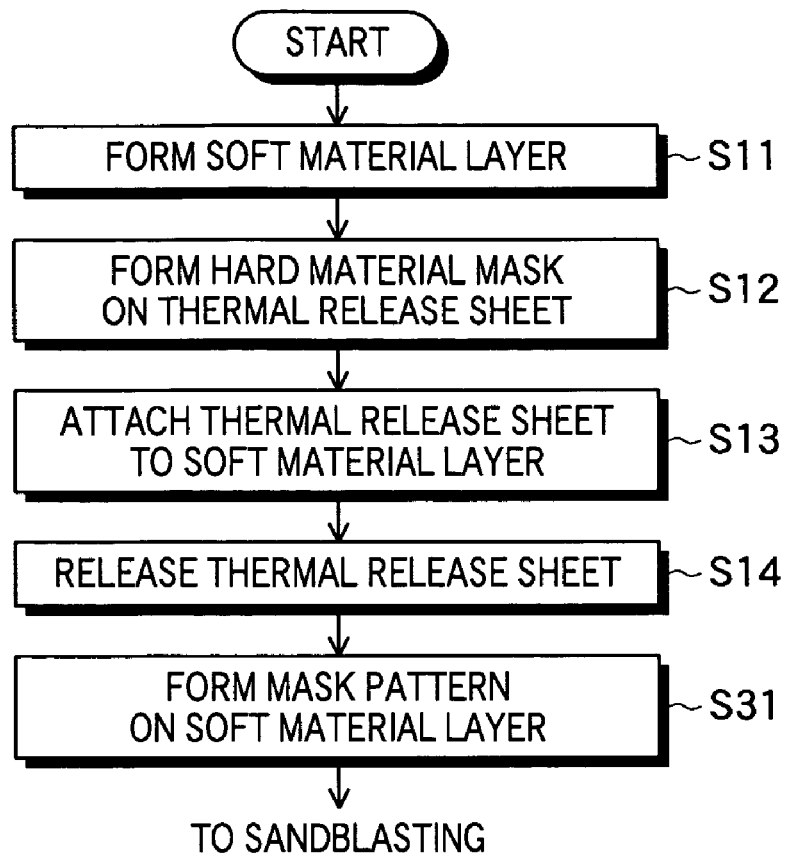
FIG. 9 is a flowchart showing a fabricating method of a mask according to the third embodiment of the present invention.

FIG. 9 is a flowchart showing the fabricating method of the mask according to the embodiment.

At steps S11 to S14, as shown in FIGS. 4A to 4D, the thermal release sheet 3, on which the hard material mask 4 has been formed, is attached onto the soft material layer 2 that has been formed on the PZT plate material 1, and the thermal release sheet 3 is overheated and released. Here, as the soft material layer 2, a non-photosensitive member such as an adhesive or the like may be used. The details of the process at steps S11 to S14 are the same as described in the first embodiment of the present invention.

Then, at step S31, a mask pattern is formed by removing the region of the soft material layer 2 on which the hard material mask 4 is not formed. At that time, a publicly known method such as dry etching, wet etching, sandblasting and so on can be used. Thereby, as shown in FIG. 5B, the mask 20 including the soft material layer 21 and the hard material layer 22 is fabricated. Furthermore, a desired pattern is formed on the PZT plate material 1 by performing sandblasting by using the mask 20.

Next, a mask according to the fourth embodiment of the present invention will be described.

Figure 10:
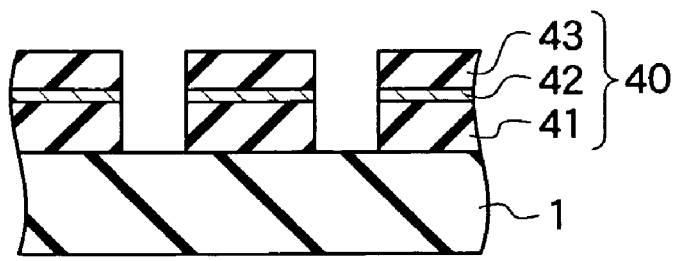
FIG. 10 is a sectional view showing the structure of a mask according to the fourth embodiment of the present invention.

FIG. 10 is a sectional view showing the mask according to the fourth embodiment. The mask 40 is a mask to be. used at the time of sandblasting, and formed on a PZT plate material 1 as a target of machining.

The mask 40 includes a first soft material layer 41, a hard material layer 42, and a second soft material layer 43. The first soft material layer 41 is formed by employing an adhesive or adherent material having flexibility and elasticity directly on the PZT plate material 1. The first soft material layer 41 serves as a cushion for absorbing a shock applied onto the hard material layer 42 at the time of sandblasting. This first soft material layer 41 may be either of photosensitive or non-photosensitive material.

The hard material layer 42 is formed as a film of a hard material such as a metal or ceramics on the first soft material layer 41. The hard material layer 42 protects the soft material layer 41 at the time of blasting, and prevents the film thickness of the mask from being thinner and the pattern deformation due to receding of the edge.

The second soft material layer 43 is formed by employing a soft material having photosensitivity such as a positive type or negative type dry-film resist. The second soft material layer 43 protects the hard material layer 42 and serves as a mask when a pattern is formed in the first soft material layer 41 and the hard material layer 42. The second soft material layer 43 may be a member having weak adhesion or adhesiveness.

As shown in FIG. 10, since the uppermost layer of the mask 40 is formed by employing a soft material, the second soft material layer 43 is easily damaged at the time of blasting. However, even if the film thickness of the second soft material layer 43 becomes thinner or its edge recedes, the pattern of the whole mask is maintained by the hard material layer 42 in the under layer thereof, and therefore, good masking performance can be maintained even when sandblasting is performed for a long time. Further, in the case where the thickness of the soft material layer 41 is thick, as long as the resolution of the second soft material layer 43 is high, machining at a high aspect ratio can be performed.

Figure 11:
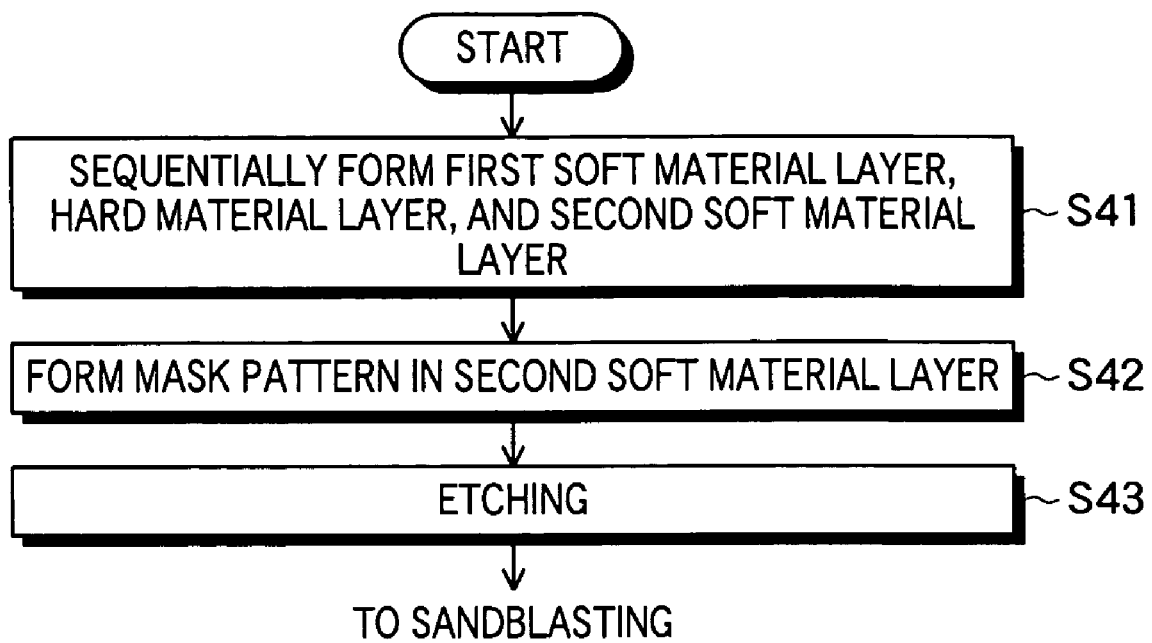
FIG. 11 is a flowchart showing a fabricating method of the mask according to the fourth embodiment of the present invention.

Next, a fabricating method of the mask according to the fourth embodiment of the present invention will be described. FIG. 11 is a flowchart showing the fabricating method of the mask according to the fourth embodiment. FIGS. 12A to 12D are diagrams for explanation of the fabricating method of the mask according to the fourth embodiment.

Figure 12A:
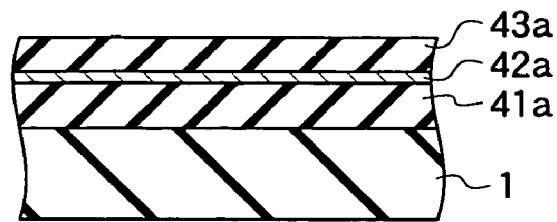
FIGS. 12A to 12D are diagrams for explanation of the fabricating method of the mask according to the fourth embodiment of the present invention.

At step S41 in FIG. 11, as shown in FIG. 12A, a first soft material layer 41a, a hard material layer 42a, and a second soft material layer 43a are sequentially formed on a PZT plate material 1.

Figure 12B:
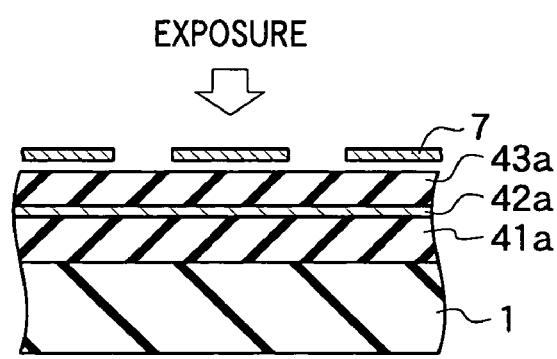

Then, at step S42, as shown in FIG. 12B, the second soft material layer 43a is exposed to light by using a photomask 7 and further developed. Thereby, as shown in FIG. 12C, the second soft material layer 43, in which a mask pattern is formed, is obtained.

Figure 12C:
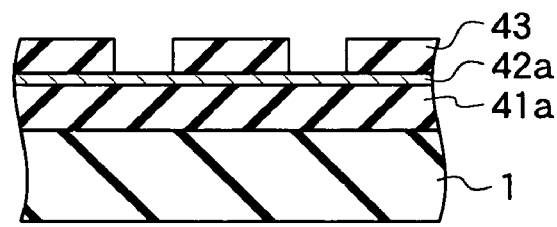

At step S43, by using the second soft material layer 43 shown in FIG. 12C as a mask, etching is performed on the hard material layer 42a and the first soft material layer 41a. The etching method to be used at the time may be either dry etching or wet etching, and a publicly known etching method can be used. Further, the etching method may be changed between the hard material layer 42a and the first soft material layer 41a, and a suitable etching method may be selected according to the material.

Figure 12D:
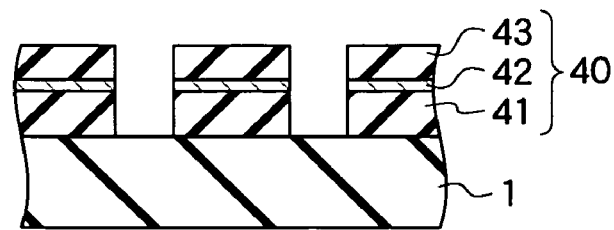

Thereby, as shown in FIG. 12D, the mask 40 including the first soft material layer 41, the hard material layer 42, and the second soft material layer 43 is fabricated. Furthermore, by performing sandblasting by using the mask 40, a desired pattern is formed on the PZT plate material 1.

According to this embodiment, the pattern is formed in the under layer by using the second soft material layer as a mask, and therefore, the range of choice of the material usable for the under layer such as the first soft material layer can be broadened.

In this embodiment, the mask in which single layers of the first soft material layer 41, the hard material layer 42, and the second soft material layer 43 are stacked is fabricated, however, a mask having a periodic structure may be formed by further stacking these layers alternately. Especially, in the case of forming a pattern with a large aspect ratio, it is desired that the number of stacked layers is determined according to the drilling depth.

Figure 13:
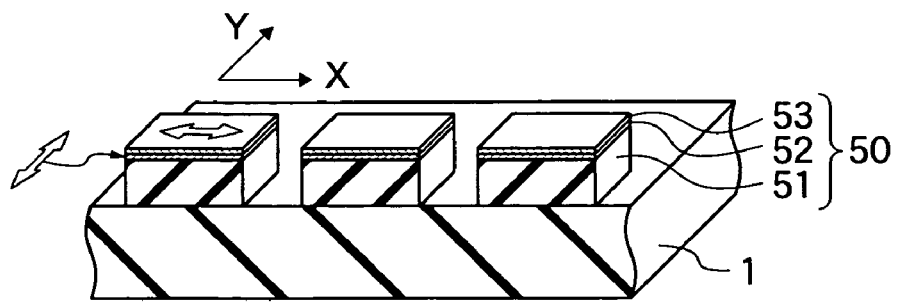
FIG. 13 is a partially sectional perspective view showing a mask according to the fifth embodiment of the present invention.

Next, a mask according to the fifth embodiment of the present invention and a manufacturing method thereof will be described. FIG. 13 is a partially sectional perspective view showing the mask according to the fifth embodiment. In FIG. 13, a state, in which a mask 50 according to this embodiment is disposed on a PZT plate material 1 as a target of machining, is shown. In FIG. 13, an arrow indicates the rolling direction of a metal plate.

The mask 50 includes a soft material layer 51, a first metal layer 52 and a second metal layer 53. The soft material layer 51 is formed by employing a soft material having elasticity as DFR or a general resist as well as in the first embodiment of the present invention.

The first metal layer 52 and the second metal layer 53 are disposed as hard material layers for protecting the edge of the soft material layer 51. The thickness of each of the first metal layer 52 and the second metal layer 53 is, for example, about 20 µm to 30 µm, and it is desired that the total thickness of the two metal layers is set about 50 µm. Further, as materials of the first metal layer 52 and the second metal layer 53, a metal such as SUS (stainless steel), copper (Cu), iron (Fe), nickel (Ni), tungsten (W), and molybdenum (Mo), or an alloy of them can be used as well as in the first embodiment of the present invention.

The first metal layer 52 and the second metal layer 53 are disposed such that the respective rolling directions are not in parallel with each other. For example, in FIG. 13, these metal layers are disposed such that the rolling direction of the first metal layer 52 is in parallel with the Y axis and the rolling direction of the second metal layer 53 is in parallel with the X axis.

Figure 14A:
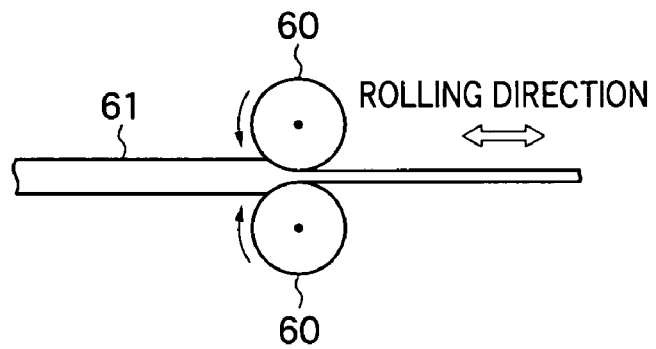
FIGS. 14A and 14B are diagrams for explanation of the curvature of a metal plate relating to its rolling direction.
Figure 14B:
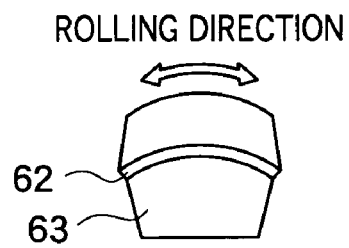

The reason why the rolling directions of the two metal layers are thus shifted is as follows. As shown in FIG. 14A, generally, a metal plate is fabricated by extending a metal material 61 by applying pressure by using a roller 60 in one direction until the thickness of the material becomes a desired thickness. On this account, as shown in FIG. 14B, in the case where sandblasting is performed by using a mask including a metal plate 62 and a soft material layer 63, when the machining time becomes significantly longer, the metal plate is curved in a certain direction. It is thought that this phenomenon is caused by change in composition or residual stress of the metal plate produced at the time of rolling.

In order not to produce such curvature, it is conceivable to thicken the metal plate for reinforcement. However, if the metal plate becomes thicker, it becomes difficult to form a mask pattern in the metal plate by using isotropic etching or the like. Especially, formation of a pattern with pitches of approximately 100 μm or less is significantly difficult at the present stage. Further, since thickening the metal plate increases the thickness of the entire mask, abrasive grain becomes easy to be reflected on the mask side surface. On this account, the capability to reliably shield the target of machining from abrasive grain is degraded, and therefore, the accuracy of the pattern formation becomes lower. Especially, in the case of performing high aspect drilling, it becomes difficult to maintain the vertical form of the pattern side surface.

Accordingly, in the embodiment, the hard material layer is formed by stacking the two metal plates while shifting the respective rolling directions. Thereby, the respective curving of the metal plates are impeded with each other, and mask deformation can be suppressed for a long time. Further, by making the total thickness of the two metal plates, for example, nearly the same as the hard material layer 22 of the mask shown in FIG. 1, the accuracy of the formed pattern can be maintained.

Figure 15:
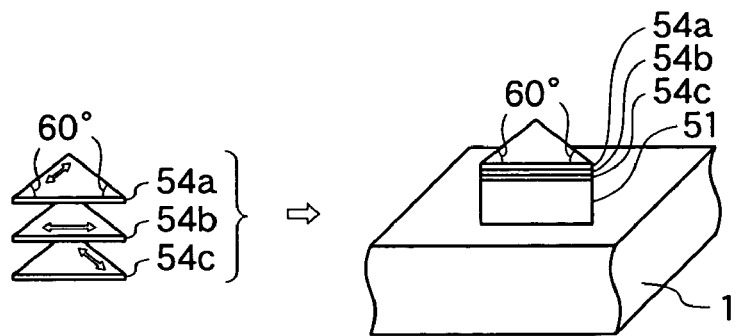
FIG. 15 is a diagram for explanation of a stacking method of metal plates according to a mask shape.

In this embodiment, the hard material layer of the mask is formed by disposing the two metal layers 52 and 53 such that the respective rolling directions may form an angle of 90° (within ±10°) with each other, however, the number of stacked metal layers and the angle formed by the rolling directions are not limited to these values. That is, at least two metal plates may be disposed such that the respective rolling directions are not in parallel. Here, since the distribution of the force that the mask surface receives from the abrasive grain is different according to the shape of the mask, the ease of curvature of the metal plate becomes different according to the distribution. Accordingly, it is desired that the number of stacked metal layers and the angle formed by the rolling directions are defined according to the mask shape. For example, in the case where the mask shape is n-fold rotational symmetry, n metal layers are stacked by rotating the metal layers such that their rolling directions may be shifted 180°/n (within ±10°) with each other. Specifically, as shown in FIG. 15, when the mask shape is 3-fold rotational symmetry, the hard material layer of the mask may be formed by stacking three-layer metal layers 54a to 54c such that their rolling directions may be shifted 60° with each other. In FIG. 15, arrows represent the rolling directions.

The hard material layer including such plural metal layers is fabricated by adjusting the orientations of the metal plates according to the rolling directions and bonding the plates. At the time of bonding, a general adhesive may be used or diffusion bonding may be used. Here, the diffusion bonding is a bonding method of overlapping plural metal plates and heating them while applying pressure to the bonded surfaces. Thereby, atoms near the respective bonded surfaces of the metal plates are diffused to the opposed surfaces, and accordingly, the plural metal plates are securely brought into close contact.

By using thus fabricated hard material layer in the fabricating method of the mask according to the first to fourth embodiments of the present invention, the strength of the mask can be further increased.

As described above, according to the embodiment, a high strength mask that can endure the sandblasting for a significantly long time can be fabricated without thickening the hard material layer. Therefore, by using such a mask, a high aspect pattern can be formed with high accuracy.

Next, modified examples of the mask according to the fifth embodiment of the present invention will be described by referring to FIGS. 16A to 16C.

Figure 16A:
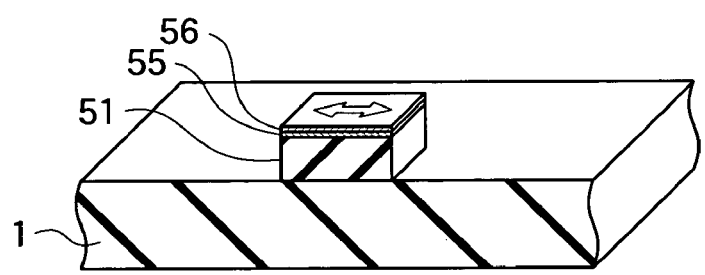
FIGS. 16A to 16C show a modified example of the mask according to the fifth embodiment of the present invention.

FIG. 16A is a partially sectional perspective view showing the first modified example of the mask according to the fifth embodiment. This mask includes a soft material layer 51, a reinforcing layer 55, and a metal layer 56. For the reinforcing layer 55, a honeycomb structure formed by a metal or ceramics is used. In this example, anodized porous alumina having a honeycomb structure is used. Thus, the metal layer 56 is reinforced by the reinforcing layer 55, and thereby, the curvature of the metal layer 56 to the rolling direction is suppressed so as to prevent the mask deformation.

Figure 16B:
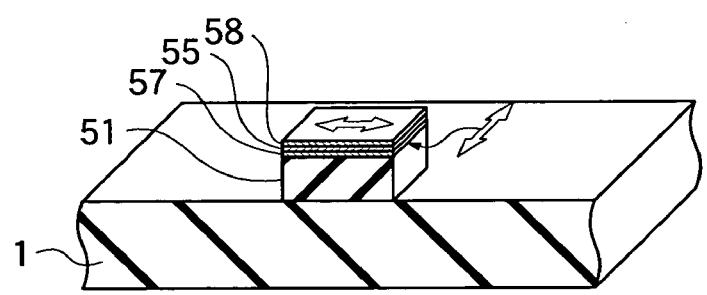

FIG. 16B is a partially sectional perspective view showing the second modified example of the mask according to the fifth embodiment. This mask includes a soft material layer 51, two metal layers 57 and 58 disposed such that the rolling directions are shifted with each other, and a reinforcing layer 55 disposed between the two metal layers 57 and 58. By thus disposing the two metal layers 57 and 58 and further reinforcing them with the reinforcing layer 55, the effect of suppressing the mask deformation can be increased further.

Figure 16C:
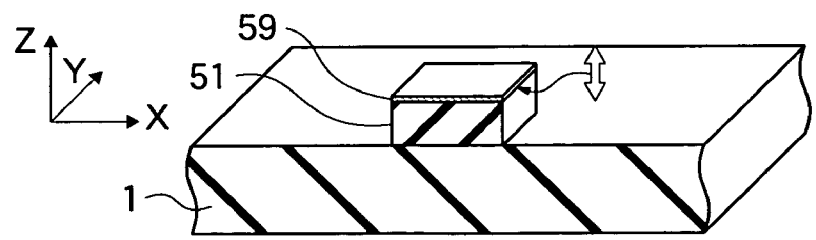

FIG. 16C is a partially sectional perspective view showing the third modified example of the mask according to the fifth embodiment. This mask includes a soft material layer 51 and a metal layer 59. The metal layer 59 is disposed such that the rolling direction thereof may be in parallel with the Z-axis. Thus, by aligning the orientation of the force that the mask is received from abrasive grain at the time of sandblasting (Z axis direction) with the rolling direction of the metal layer 59, the mask deformation can be suppressed also in the case of using only one metal layer.

Next, a fabricating method of a mask according to the sixth embodiment of the present invention will be described. The method according to this embodiment is a method for fabricating the mask 20 as shown in FIG. 1 and the mask 40 as shown in FIG. 10. In this embodiment, a dispenser (fixed amount discharge device) is used for fabricating those masks.

The dispenser includes a needle or nozzle for discharging a material in a liquid form or a paste form, a supplying unit having a syringe, barrel, valve, pump or the like for supplying the material to the needle, and a controller for adjusting a discharge amount of the material and so on. The dispenser can discharge a desired amount of material to a desired region with high accuracy. Such dispenser is prepared in various types for purposes such as conduction of IC chips, adhesive application, etc., and utilized in a wide range of fields including an electronics field, a medical field, a food field, etc.

FIGS. 17A to 17D are diagrams for explanation of the fabricating method of the mask according to the embodiment and a machining method of a material using the mask.

Figure 17A:
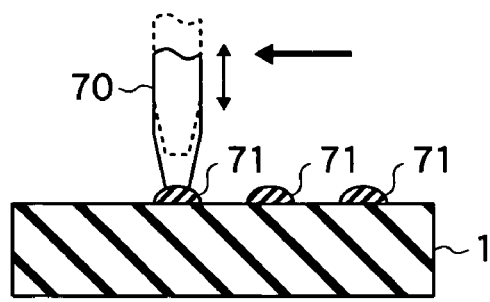
FIGS. 17A to 17D are diagrams for explanation of a fabricating method of a mask according to the sixth embodiment of the present invention and a machining method of a material using the mask.

First, as shown in FIG. 17A, a target of machining such as a PZT plate material 1 is prepared, and an elastic material in a liquid form or a paste form is discharged from a needle 70 and applied onto the target of machining to form a mask pattern, and further cured to form a soft material layer 71. As the elastic material, a resin material such as epoxy, urethane, and silicon is used. In order to cure the liquid or paste form elastic material, the elastic material applied to the target of machining may be kept at a temperature which is set in accordance with the material (e.g., room temperature to a hundred and several dozen temperature) for a predetermined time. Alternatively, as the elastic material, an ultraviolet (UV) curing resin material may be used.

Figure 17B:
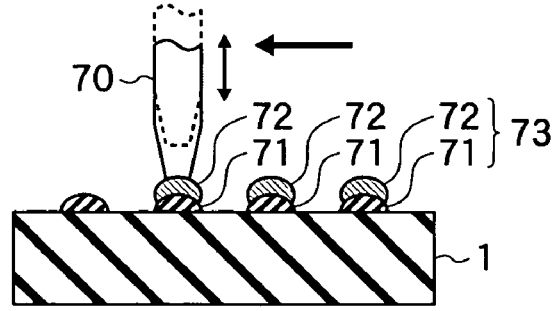

Next, as shown in FIG. 17B, a liquid or paste form hard material is discharged from the needle 70 and applied onto the soft material layer 71, and further, cured to form a hard material layer 72. As the hard material, metal paste such as silver paste, solder, or the like can be used. In order to cure the metal paste or the like, the paste applied to the soft material layer 71 may be fired at predetermined temperature for a predetermined time. Alternatively, as the hard material, ultraviolet (UV) curing paste may be used. Thereby, a mask 73 including the soft material layer 71 and the hard material layer 72 is fabricated. By the way, in the case where a mask as shown in FIG. 10 is formed, a liquid or paste form elastic material may be further applied onto the hard material layer by using the dispenser and then cured.

Here, the combination of the elastic material to be used for the soft material layer 71 and the hard material to be used for the hard material layer 72 is desirably selected from the relationship with the temperature at which the liquid or paste form material is cured in addition to the view of the ratio of Young's modulus, as described above. The reason is that there is the possibility that the resin to be used as the soft material layer 71 is deformed or thermally decomposed at a high temperature largely exceeding the glass transition point or resistible heat and its quality is altered. Here, the glass transition point is a boundary temperature when a resin structure changes from the glass state into the rubber state, i.e., when the elastic modulus is rapidly reduced. For example, the glass transition point after once cured is about 60° C. to about 150° C. for epoxy resin, and about 100° C. for urethane resin. Further, the resistible temperature of silicon resin is about 250° C. On the other hand, as for the silver (Ag) paste, there are low temperature type that cures by firing at a temperature about 100° C. for sixty minutes and high temperature type that cures by firing at a temperature about 150° C. to 290° C. for 20 to 30 minutes. Further, as for the solder paste, there are low temperature type that cures by firing at temperature about 150° C. to 160° C. for several tens of seconds and high temperature type that cures by firing at temperature about 220° C. for several tens of seconds. On this account, it is important to select a combination of materials in which the firing temperature of the metal paste never exceeds largely the glass transition point or a resistible temperature of the resin to be used as the soft material layer 71. Since many resin materials only become soft when heated nearly at the glass transition point but never lead to fluidization or change in quality, it can be fired nearly at the glass transition point. For example, if the urethane resin having the glass transition point of nearly 100° C. is used in combination with the low-temperature type silver paste having the firing temperature about 100° C., there is no problem in intended use in the embodiment. Further, the UV curing silver paste that cures by being applied with ultraviolet light can be combined with a resin having a lower glass transition point.

Specifically, as the material used for the soft material layer 71, an epoxy resin such as a product of EPOXY TECHNOLOGY INC., EPO-TEK 330 (glass transition point at 90° C. or more, Shore D hardness about 80) and EPO-TEK 310 (decomposition temperature about 326° C., Shore D hardness about 22 (flexible)) are cited. Here, the Shore D hardness represents hardness measured by a Shore durometer of D type (for high hardness), and the larger numerical value represents that the material is harder. Further, generally, Young's modulus of the epoxy resin is anticipated about $10^{-9}$ Pa to $10^{-7}$ Pa. On the other hand, the material used for the hard material layer 72, silver paste manufactured by EPOXY TECHNOLOGY INC., EPO-TEK H35-175MP (curing condition at 165° C. for 1.5 hours to 180° C. for one hour), solder paste of 207 series (Young's modulus about $2\times10^{10}$ Pa to $4\times10^{10}$ Pa) manufactured by NIHON HANDA CO., LTD. (Japan), etc. are cited. Therefore, by combining, for example, EPO-TEK 310 as the soft material layer 71 with solder paste as the hard material layer 72, the mask 73 having a high ratio of Young's modulus and good performance can be fabricated.

Figure 17C:
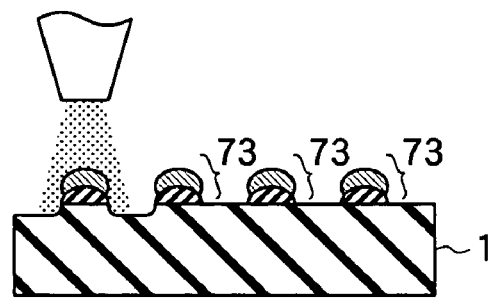
Figure 17D:
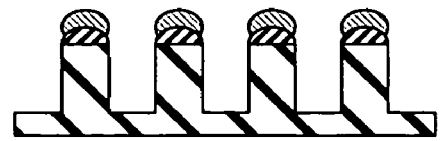

Next, as shown in FIG. 17C, sandblasting is performed by spraying abrasive grain onto the PZT plate material 1 on which the mask 73 has been formed. Thereby, as shown in FIG. 17D, a structure in which plural piezoelectric bodies are arranged in a desired layout is fabricated. Furthermore, the mask 73 is removed in accordance with a method such as wet etching.

According to this embodiment, unlike the case where the metal rolled plate is used as the hard material layer (metal layer), no problem of anisotropy of the hard material layer occurs. Accordingly, a mask that hardly curves even during sandblasting can be fabricated at fewer steps. Further, since the soft material layer and the hard material layer are formed by using liquid or paste form materials, a mask having an arbitrary shape and arbitrary arrangement can be fabricated easily.

In the above-mentioned first to sixth embodiments, the mask to be used in sandblasting and the fabricating method thereof are described, however, such a mask can be used in a material machining method other than the sandblasting method. For example, pattern formation may be performed by using the mask according to any one of the first to sixth embodiments in a dry etching method represented by a plasma etching or a wet etching method.

Figure 18:
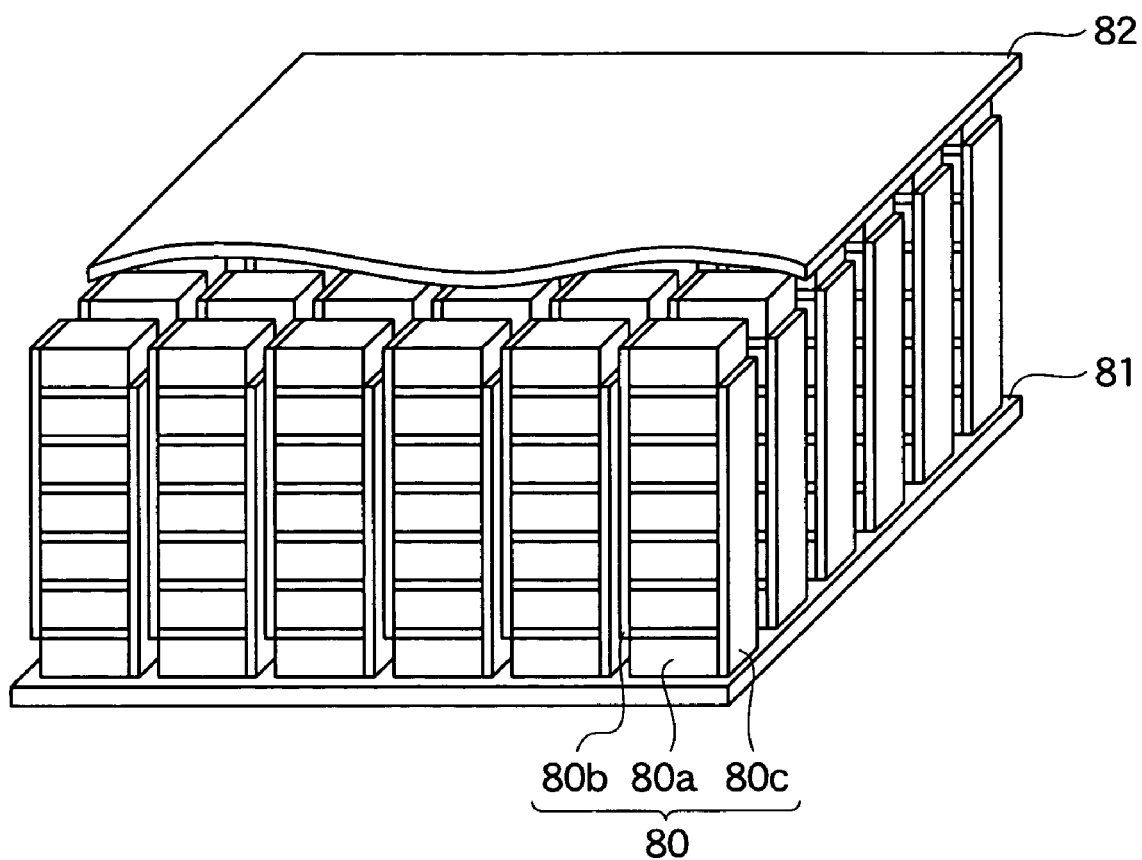
FIG. 18 is a perspective view showing an ultrasonic transducer array.

By using the mask according to any one of the abovementioned first to sixth embodiments, an ultrasonic transducer array as, for example, shown in FIG. 18 can be fabricated. This ultrasonic transducer array includes plural ultrasonic transducers 80 arranged in a two-dimensional matrix, an interconnection board 81, and a common electrode 82.

Each ultrasonic transducer 80 includes a laminated structure 80a in which plural piezoelectric material layers such as PZT and plural internal electrode layers are stacked alternately, and side electrodes 80b and 80c disposed on two opposed surfaces. In such ultrasonic transducer 80, since the stacked plural layers are connected in parallel by the side electrodes 80b and 80c, while miniaturizing the device, the capacity between electrodes of the entire device can be made larger compared with the case of using a single-layered structure.

Such ultrasonic transducer array is fabricated as below. First, on the interconnection board 81 on which plural electrodes corresponding to the arrangement of the plural ultrasonic transducers 80 have been formed, a laminated structure in which piezoelectric material layers and internal electrodes are alternately arranged is formed. Then, as described in the first to sixth embodiments, a mask having a desired shape is disposed on the laminated structure in a desired arrangement, and dicing is performed in accordance with the sandblasting method. In the dicing according to the sandblasting method, since heat and stress produced by friction becomes smaller compared with the case of using a general dicer, the sections of the laminated structures and the boundaries of the respective layers are less affected. Furthermore, the side electrodes 80b and 80c are disposed on the side surfaces of each divided laminated structure 80a and the common electrode 82 is disposed thereon.

In such ultrasonic transducer array, voltages are applied to the respective ultrasonic transducers 80 via the plural electrodes formed on the interconnection board 81 and the common electrode 82. Thereby, ultrasonic waves are generated from the respective ultrasonic transducers 80. At that time, by driving the plural ultrasonic transducers 80 while providing predetermined delay time thereto, an ultrasonic beam focused in a desired direction and a depth can be formed.

Here, the method for arranging the plural ultrasonic transducers 80 (laminated structures 80*a*) is not limited to the two-dimensional matrix form. For example, one-dimensional array, two-dimensional array in which several one-dimensional arrays are arranged in parallel (also referred to as "1.5-dimensional array"), concentric form arrangement, or random arrangement may be adopted. Furthermore, by providing an acoustic matching layer, a backing layer and so on to such an ultrasonic transducer array, an ultrasonic probe to be used for ultrasonic diagnostic equipment can be fabricated.

As described above, since an ultrasonic transducer array can be fabricated easily with high accuracy by using the mask according to any one of the first to sixth embodiments of the present invention, productivity of an ultrasonic transducer array and an ultrasonic probe including the ultrasonic transducer array can be improved. Further, since an ultrasonic transducer array having arbitrary arrangement can be formed by arbitrarily arranging the mask, an ultrasonic probe capable of ultrasonic transmission and reception with suppressed crosstalk can be fabricated.

Furthermore, the mask according to any one of the first to sixth embodiments of the present invention can be used in various fields other than that of the ultrasonic transducer array. As below, a manufacturing method of an optical shutter array using the mask according to any one of the first to sixth embodiments of the present invention will be described.

The optical shutter array is a switching device to be used for an image writing head of a printer, facsimile, etc. An optical shutter array constituted by a material showing the Electro-Optic effect (EO effect) is broadly applied because it can control open and close of an optical path at high speed with accuracy, and improvement in the manufacturing method thereof etc. is being promoted in order to raise the performance and manufacture yield. Here, the EO effect is a phenomenon in which a refractive index of an optical material changes by applying an electric field to the optical material.

Figure 19:
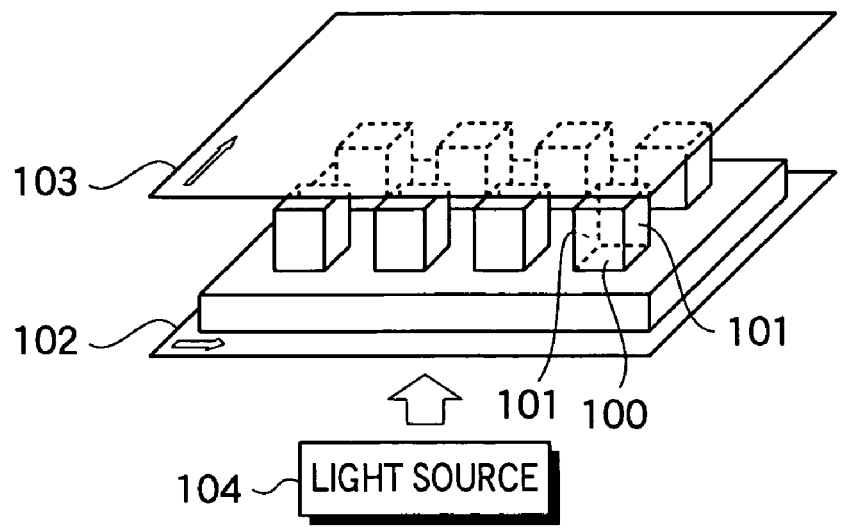
FIG. 19 is a perspective view showing an optical shutter array.

FIG. 19 is a perspective view showing an optical shutter array using PLZT as a material showing the EO effect. This optical shutter array includes plural PLZT elements 100 each having electrodes 101 provided on two opposed side surfaces. The PLZT elements 100 have rectangular solid shapes having sides of 100 μm and height of 100 μm or more for example, and arranged with 110 μm pitches. An array including such plural PLZT elements 100 is disposed between two polarizing plates 102 and 103 positioned such that the polarizing directions thereof may be shifted by 45 degrees. Further, in the lower region of the drawing, a light source 104 such as a halogen lamp is disposed to illuminate the polarizing plate 102, the PLZT elements 100, and the polarizing plate 103.

The light source beam emitted from the light source 104 is polarized by being transmitted through the polarizing plate 102, and further, transmitted through the PLZT elements 100. Here, in a normal condition, due to the arrangement of the polarizing plate 102 and the polarizing plate 103, the light source beam that has been polarized by the polarizing plate 102 can hardly be transmitted through the polarizing plate 103. At this time, when voltages are applied to the PLZT elements 100 via the electrodes 101, the PLZT elements 100 change their refractive indices by the EO effect, and the plane of polarization of the transmitted light is rotated. Thereby, the beam transmitted through the PLZT elements 100 is transmitted through the polarizing plate 103. Accordingly, by controlling the voltages applied to the respective PLZT elements 100, ON and OFF of the beams emitted from the positions corresponding to the elements can be controlled.

Such PLZT element is generally fabricated by dicing a PLZT plate material. However, if dicing is performed, the element is scratched or broken, or optical characteristics of the element changes due to stress, and thereby, the performance of the optical shutter is degraded. On this account, in the embodiment, the PLZT element is fabricated in accordance with the sandblasting method.

Figure 20:
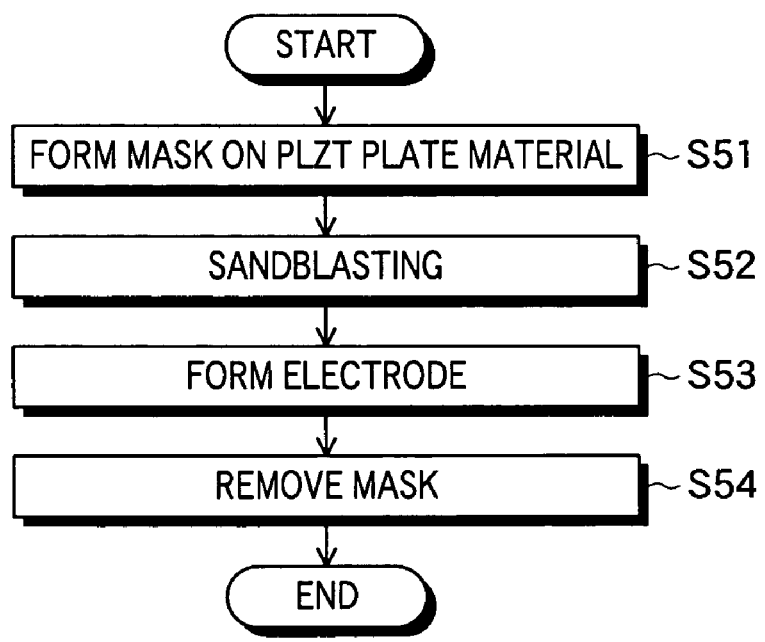
FIG. 20 is a flowchart showing a manufacturing method of the optical shutter array.

FIG. 20 is a flowchart showing a manufacturing method of the optical shutter array according to this embodiment. Further, FIGS. 21A to 21D are diagrams for explanation of the manufacturing method of the optical shutter array according to this embodiment.

Figure 21A:
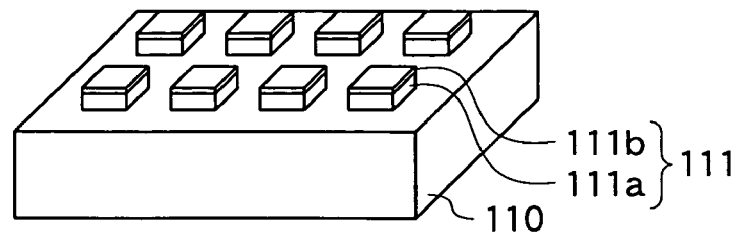
FIGS. 21A to 21D are diagrams for explanation of the manufacturing method of the optical shutter array.

First, at step S51, as shown in FIG. 21A, a mask 111 having a desired pattern is formed on a PLZT plate material 110. As a fabricating method of the mask 111, the fabricating method of the mask according any one of the first to sixth embodiments of the present invention may be used. In FIG. 21A, the mask including a soft material layer 111*a* and a hard material layer 111*b* is shown.

Figure 21B:
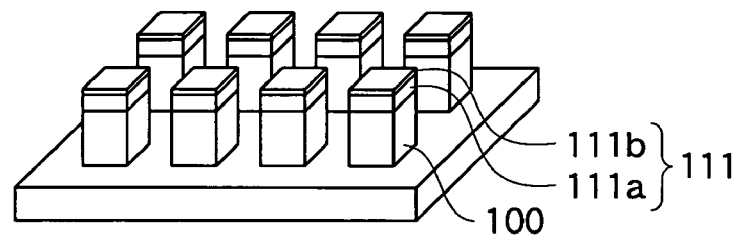

Then, at step S52, as shown in FIG. 21B, by performing sandblasting, a pattern is formed on the PLZT plate material 110.

Figure 21C:
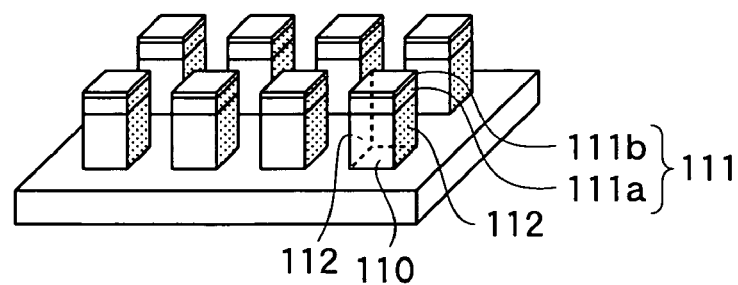

At step S53, as shown in FIG. 21C, by forming metal films of aluminum or the like on the opposed side surfaces of the respective PLZT elements 100 in accordance with a method such as sputtering, for example, electrodes 112 are formed.

Figure 21D:
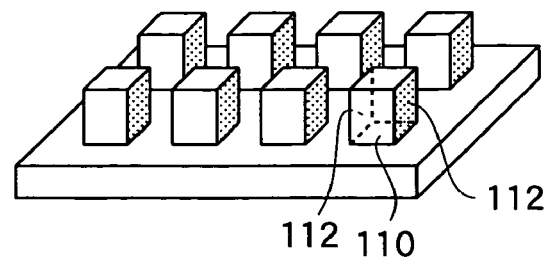

At step S54, the mask 111 is removed by wet etching for example. Thereby, as shown in FIG. 21D, a PLZT element array in which plural PLZT elements 100 are arranged is fabricated.

Furthermore, by leading out interconnections from the electrodes 112 and disposing polarizing plates and a light source, the optical shutter array as shown in FIG. 19 is manufactured. Regarding the detail of the optical shutter array, see Publication of Japanese Patent Applications JP-A-5-93893, JP-A-5-188337, JP-2001-21856A, and JP-P2001-33834A. The disclosures of those applications are incorporated herein by reference.

As described above, according to the sandblasting method, micromachining with high aspect can be performed without damaging the optical characteristics of the PLZT element. Therefore, an optical shutter array having high performance can be manufactured easily and the PLZT elements can be further highly integrated.

Other than that, various precision instruments and devices such as a micro-reactor, micro-mirror and so on may be manufactured in accordance with the sandblasting method.

The micro-reactor is a reactor in which microchannels each having a width of about several micrometers to several hundreds of micrometers are formed on a base material such as a silicon wafer. By using the micro-reactor, chemical reaction and chemical analysis can be performed by using a tiny amount of chemical while controlling the amount and the temperature of the chemical accurately. Recently, the development of a micro-reactor array in which cells having micro-reactors formed therein are arrayed is being promoted. Further, the micro-mirror is an MEMS device in which a minute mirror having sides about 16 μm is connected to an actuator of PZT or the like via a hinge. In these precision instruments, according to the sandblasting method at the time of machining the silicon wafer, PZT, etc., machining with high aspect and high accuracy can be performed without going through a complex manufacturing process.

The invention claimed is:

1. A method of fabricating a mask, said method comprising the steps of:
   (a) forming a soft material layer by disposing a soft material having positive photosensitivity and at least one of adhesion and adhesiveness on a material as a target of machining;
   (b) forming a hard material layer by disposing an opaque hard material, with which a desired mask pattern has been formed in advance, on said soft material layer; and
   (c) forming the mask pattern in said soft material layer by performing exposure to light and development on said soft material layer by using said hard material as a photomask,
   wherein step (b) includes:
   forming the mask pattern of said hard material on a releasable member having adhesion that is reduced by at least one of an external stimulus and external energy; and
   transferring the mask pattern of said hard material formed on said releasable member onto said soft material layer by attaching said releasable member formed with the mask pattern of said hard material to said soft material layer, and then, applying at least one of external stimulus and external energy to said releasable member to release said member from said hard material and said soft material layer, leaving only said hard material in the mask pattern on said soft material layer.

2. A method of fabricating a mask, said method comprising the steps of:
   (a) forming a soft material layer by disposing a soft material having at least one of adhesion and adhesiveness on a material as a target of machining;
   (b) forming a hard material layer by disposing a hard material, with which a desired mask pattern has been formed in advance, on said soft material layer; and
   (c) forming the mask pattern in said soft material layer by etching said soft material layer by using said hard material layer as a mask,
   wherein step (b) includes:
   forming the mask pattern of said hard material on a releasable member having adhesion that is reduced by at least one of an external stimulus and external energy; and
   transferring the mask pattern of said hard material formed on said releasable member onto said soft material layer by attaching said releasable member formed with the mask pattern of said hard material to said soft material layer, and then, applying at least one of external stimulus and external energy to said releasable member to release said member from said hard material and said soft material layer, leaving only said hard material in the mask pattern on said soft material layer.

3. A method of fabricating a mask, said method comprising the steps of:
   (a) forming a soft material layer by disposing a soft material having negative photosensitivity and at least one of adhesion and adhesiveness on a material as a target of machining;
   (b) forming a desired mask pattern in said soft material layer by performing exposure to light and development on said soft material layer by using a photomask in which the mask pattern has been formed; and
   (c) disposing a hard material, with which the mask pattern has been formed in advance, on said soft material layer, in which the mask pattern has been formed, while aligning them with each other,
   wherein step (c) includes:
   forming the mask pattern of said hard material on a member having adhesion that is reduced by at least one of an external stimulus and external energy; and
   transferring the mask pattern of said hard material formed on said member onto said soft material layer by attaching said member formed with the mask pattern of said hard material to said soft material layer, and then, applying at least one of external stimulus and external energy to said member to release said member from said hard material and said soft material layer, leaving only said hard material in the mask pattern on said soft material layer.

4. A method of fabricating a mask, said method comprising the steps of:
   (a) forming a first soft material layer by disposing a soft material having at least one of adhesion and adhesiveness on a material as a target of machining;
   (b) forming a hard material layer by disposing a hard material on said first soft material layer;
   (c) forming a second soft material layer by disposing a soft material having photosensitivity and at least one of adhesion and adhesiveness on said hard material layer;
   (d) forming a desired mask pattern in said second soft material layer by performing exposure to light and development on said second soft material layer by using a photomask in which the mask pattern has been formed; and
   (e) forming the mask pattern in said first soft material layer and said hard material layer by using said second soft material layer, in which the mask pattern has been formed, as a mask,
   wherein step (b) includes forming said hard material layer by stacking at least two metal plates such that respective rolling directions thereof are not in parallel with each other.

5. The method according to claim 4, wherein step (e) includes forming the mask pattern in accordance with a pattern forming method including one of an etching method and a sandblasting method.

6. A method of fabricating a mask, said method comprising the steps of:
   (a) forming a soft material layer by disposing a soft material having positive photosensitivity and at least one of adhesion and adhesiveness on a material as a target of machining;
   (b) forming a hard material layer by disposing an opaque hard material, with which a desired mask pattern has been formed in advance, on said soft material layer; and
   (c) forming the mask pattern in said soft material layer by performing exposure to light and development on said soft material layer by using said hard material layer as a photomask,
   wherein step (b) includes forming said hard material layer by stacking at least two metal plates such that respective rolling directions thereof are not in parallel with each other.

7. A method of fabricating a mask, said method comprising the steps of:
   (a) forming a soft material layer by disposing a soft material having at least one of adhesion and adhesiveness on a material as a target of machining;
   (b) forming a hard material layer by disposing a hard material, with which a desired mask pattern has been formed in advance, on said soft material layer; and (c) forming the mask pattern in said soft material layer by etching said soft material layer by using said hard material layer as a mask, wherein step (b) includes forming said hard material layer by stacking at least two metal plates such that respective rolling directions thereof are not in parallel with each other.

8. A method of fabricating a mask, said method comprising the steps of:
  (a) forming a soft material layer by disposing a soft material having negative photosensitivity and at least one of adhesion and adhesiveness on a material as a target of machining;
  (b) forming a desired mask pattern in said soft material layer by performing exposure to light and development on said soft material layer by using a photomask in which the mask pattern has been formed; and
  (c) disposing a hard material, with which the mask pattern has been formed in advance, on said soft material layer, in which the mask pattern has been formed, while aligning them with each other, wherein step (b) includes forming said hard material layer by stacking at least two metal plates such that respective rolling directions thereof are not in parallel with each other.

9. The method according to claim 1, wherein said mask pattern includes a plurality of isolated patterns.

10. The method according to claim 2, wherein said mask pattern includes a plurality of isolated patterns.

11. The method according to claim 3, wherein said mask pattern includes a plurality of isolated patterns.

12. The method according to claim 4, wherein said mask pattern includes a plurality of isolated patterns.

13. A machining method of a material comprising the steps of:
  (a) forming a soft material layer by disposing a soft material having positive photosensitivity and at least one of adhesion and adhesiveness on a material as a target of machining;
  (b) forming a hard material layer by disposing an opaque hard material, with which a desired mask pattern has been formed in advance, on said soft material layer, and processing the hard material layer so that only the hard material and soft material remain exposed in defining the mask pattern;
  (c) forming the mask pattern in said soft material layer by performing exposure to light and development on said soft material layer by using said hard material as a photomask; and
  (d) removing a region of said material as the target of machining, on which the mask pattern is not formed, in accordance with one of a sandblasting method and an etching method, wherein step (b) includes:
  forming the mask pattern of said hard material on a releasable member having adhesion that is reduced by at least one of an external stimulus and external energy; and
  transferring the mask pattern of said hard material formed on said releasable member onto said soft material layer by attaching said releasable member formed with the mask pattern of said hard material to said soft material layer, and then, applying at least one of external stimulus and external energy to said releasable member to release said member from said hard material and said soft material layer, leaving only said hard material in the mask pattern on said soft material layer.

14. A method of machining a material, said method comprising the steps of:
  (a) forming a soft material layer by disposing a soft material having at least one of adhesion and adhesiveness on a material as a target of machining;
  (b) forming a hard material layer by disposing a hard material, with which a desired mask pattern has been formed in advance, on said soft material layer, and processing the hard material layer so that only the hard material and soft material remain exposed in defining the mask pattern;
  (c) forming the mask pattern in said soft material layer by etching said soft material layer by using said hard material as a mask; and
  (d) removing a region of said material as the target of machining, on which the mask pattern is not formed, in accordance with one of a sandblasting method and an etching method, wherein step (b) includes:
  forming the mask pattern of said hard material on a releasable member having adhesion that is reduced by at least one of an external stimulus and external energy; and
  transferring the mask pattern of said hard material formed on said releasable member onto said soft material layer by attaching said releasable member formed with the mask pattern of said hard material to said soft material layer, and then, applying at least one of external stimulus and external energy to said releasable member to release said member from said hard material and said soft material layer, leaving only said hard material in the mask pattern on said soft material layer.

15. A method of machining a material, said method comprising the steps of:
  (a) forming a soft material layer by disposing a soft material having negative photosensitivity and at least one of adhesion and adhesiveness on a material as a target of machining;
  (b) forming a mask pattern in said soft material layer by performing exposure to light and development on said soft material layer by using a photomask in which a desired mask pattern has been formed;
  (c) disposing a hard material, in which the mask pattern has been formed in advance, on said soft material layer, in which the mask pattern has been formed, while aligning them with each other; and
  (d) removing a region of said material as the target of machining, on which the mask pattern is not formed, in accordance with one of a sandblasting method and an etching method, wherein step (b) includes:
  forming the mask pattern of said hard material on a releasable member having adhesion that is reduced by at least one of an external stimulus and external energy; and
  transferring the mask pattern of said hard material formed on said releasable member onto said soft material layer by attaching said releasable member formed with the mask pattern of said hard material to said soft material layer, and then, applying at least one of external stimulus and external energy to said releasable member to release said member from said hard material and said soft material layer, leaving only said hard material in the mask pattern on said soft material layer.

16. A machining method of a material comprising the steps of:
  (a) forming a first soft material layer by disposing a soft material having at least one of adhesion and adhesiveness on a material as a target of machining;

(b) forming a hard material layer by disposing a hard material on said first soft material layer;
(c) forming a second soft material layer by disposing a soft material having photosensitivity and at least one of adhesion and adhesiveness on said hard material layer;
(d) forming a desired mask pattern in said second soft material layer by performing exposure to light and development on said second soft material layer by using a photomask in which the mask pattern has been formed;
(e) forming the mask pattern in said first soft material layer and said hard material layer by using said second soft material layer, in which the mask pattern has been formed, as a mask; and
(f) removing a region of said material as the target of machining, on which the mask pattern is not formed, in accordance with one of a sandblasting method and an etching method,
wherein step (b) includes forming said hard material layer by stacking at least two metal plates such that respective rolling directions thereof are not in parallel with each other.

17. A machining method of a material comprising the steps of:
(a) forming a soft material layer by disposing a soft material having positive photosensitivity and at least one of adhesion and adhesiveness on a material as a target of machining;
(b) forming a hard material layer by disposing an opaque hard material, with which a desired mask pattern has been formed in advance, on said soft material layer;
(c) forming the mask pattern in said soft material layer by performing exposure to light and development on said soft material layer by using said hard material as a photomask; and
(d) removing a region of said material as the target of machining, on which the mask pattern is not formed, in accordance with one of a sandblasting method and an etching method,
wherein step (b) includes forming said hard material layer by stacking at least two metal plates such that respective rolling directions thereof are not in parallel with each other.

18. A method of machining a material, said method comprising the steps of:
(a) forming a soft material layer by disposing a soft material having at least one of adhesion and adhesiveness on a material as a target of machining;
(b) forming a hard material layer by disposing a hard material, with which a desired mask pattern has been formed in advance, on said soft material layer;
(c) forming the mask pattern in said soft material layer by etching said soft material layer by using said hard material as a mask; and
(d) removing a region of said material as the target of machining, on which the mask pattern is not formed, in accordance with one of a sandblasting method and an etching method,
wherein step (b) includes forming said hard material layer by stacking at least two metal plates such that respective rolling directions thereof are not in parallel with each other.

19. A method of machining a material, said method comprising the steps of:
(a) forming a soft material layer by disposing a soft material having negative photosensitivity and at least one of adhesion and adhesiveness on a material as a target of machining;
(b) forming a mask pattern in said soft material layer by performing exposure to light and development on said soft material layer by using a photomask in which a desired mask pattern has been formed;
(c) disposing a hard material, in which the mask pattern has been formed in advance, on said soft material layer, in which the mask pattern has been formed, while aligning them with each other; and
(d) removing a region of said material as the target of machining, on which the mask pattern is not formed, in accordance with one of a sandblasting method and an etching method,
wherein step (b) includes forming said hard material layer by stacking at least two metal plates such that respective rolling directions thereof are not in parallel with each other.

* * * * *